(12) United States Patent
Ito et al.

(10) Patent No.: US 6,627,391 B1
(45) Date of Patent: Sep. 30, 2003

(54) RESIST COMPOSITIONS CONTAINING LACTONE ADDITIVES

(75) Inventors: Hiroshi Ito, San Jose, CA (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 09/639,785

(22) Filed: Aug. 16, 2000

(51) Int. Cl.$^7$ ................................................. G03C 5/56
(52) U.S. Cl. ........................ 430/322; 430/325; 430/326; 430/270.1
(58) Field of Search ................................ 430/322, 325, 430/326, 270.1

(56) References Cited

U.S. PATENT DOCUMENTS

| | | | |
|---|---|---|---|
| 4,400,461 A | 8/1983 | Chandross et al. | 430/311 |
| 4,855,017 A | 8/1989 | Douglas | 156/643 |
| 5,310,619 A | 5/1994 | Crivello et al. | 430/270 |
| 5,362,663 A | 11/1994 | Bronner et al. | 437/52 |
| 5,399,647 A | 3/1995 | Nozaki | 526/297 |
| 5,429,710 A | 7/1995 | Akiba et al. | 216/17 |
| 5,468,819 A | 11/1995 | Goodall et al. | 526/171 |
| 5,562,801 A | 10/1996 | Nulty | 156/643.1 |
| 5,580,694 A | 12/1996 | Allen et al. | 430/270.1 |
| 5,585,219 A | 12/1996 | Kaimoto et al. | 430/270.1 |
| 5,618,751 A | 4/1997 | Golden et al. | 438/392 |
| 5,705,503 A | 1/1998 | Goodall et al. | 526/281 |
| 5,738,975 A | 4/1998 | Nakano et al. | 430/280.1 |
| 5,744,376 A | 4/1998 | Chan et al. | 437/190 |
| 5,750,680 A | 5/1998 | Kim et al. | 540/200 |
| 5,770,346 A | 6/1998 | Iwasa et al. | 430/270.1 |
| 5,776,657 A | 7/1998 | Schaedeli et al. | 430/281.1 |
| 5,786,131 A | 7/1998 | Allen et al. | 430/325 |
| 5,801,094 A | 9/1998 | Yew et al. | 438/624 |
| 5,821,469 A | 10/1998 | Shanmugham | 174/135 |
| 5,830,965 A | 11/1998 | Imaizumi et al. | 526/309 |
| 5,837,419 A | 11/1998 | Ushirogouchi et al. | 430/270.1 |
| 5,843,624 A | 12/1998 | Houlihan et al. | 430/296 |
| 6,048,664 A | 4/2000 | Houlihan et al. | 430/270.1 |
| 6,248,920 B1 * | 6/2001 | Takechi et al. | 560/116 |
| 6,251,560 B1 * | 6/2001 | Wallow et al. | 430/270.1 |
| 6,399,279 B1 | 6/2002 | Urano et al. | 430/302 |

FOREIGN PATENT DOCUMENTS

| | | | | |
|---|---|---|---|---|
| EP | WO 97/33198 | 9/1997 | | G03F/7/039 |
| EP | 0 880 074 A1 | 11/1998 | | G03F/7/004 |
| EP | 0952489 A1 | 4/1999 | | G03F/7/004 |
| JP | 10239845 | 9/1998 | | G03F/007/039 |
| JP | 10301283 | 11/1998 | | G03F/007/039 |
| JP | 2000-035664 | 2/2000 | | |
| JP | 2000-112130 | 4/2000 | | |

* cited by examiner

*Primary Examiner*—Mark F. Huff
*Assistant Examiner*—Daborah Chacko-Davis
(74) *Attorney, Agent, or Firm*—Steven Capella

(57) ABSTRACT

Acid-catalyzed positive resist compositions which are imageable with 193 nm radiation and are developable to form resist structures of high resolution and high etch resistance are enabled by the use of a combination of (a) an imaging polymer comprising a monomer selected from the group consisting of a cyclic olefin, an acrylate and a methacrylate, (b) a radiation-sensitive acid generator, and (c) a lactone additive. The lactone additive preferably contains at least 10 carbon atoms and more preferably at least one saturated alicyclic moiety. The imaging polymer is preferably a cyclic olefin polymer.

10 Claims, No Drawings

RESIST COMPOSITIONS CONTAINING LACTONE ADDITIVES

CROSS REFERENCE TO RELATED APPLICATIONS

Related applications are: U.S. patent application Ser. No. 09/266,342, filed Mar. 11, 1999, now abandoned titled "Photoresist Compositions with Cyclic Olefin Polymers and Additive"; U.S. patent application Ser. No. 09/266,343, filed Mar. 11, 1999, now abandoned titled "Photoresist Compositions with Cyclic Olefin Polymers and Hydrophobic Non-Steroidal Alicyclic Additives"; U.S. patent application Ser. No. 09/266,341, filed Mar. 11, 1999, now U.S. Pat. No. 6,124,074, titled "Photoresist Compositions with Cyclic Olefin Polymers and Hydrophobic Non-Steroidal Multi-Alicyclic Additives"; and U.S. patent application Ser. No. 09/266,344, filed Mar. 11, 1999, now abandoned titled "Photoresist Compositions with Cyclic Olefin Polymers and Saturated Steroid Additives". The disclosures of the above applications are incorporated herein by reference.

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

The ability to produce smaller devices is limited by the ability of lithographic techniques to reliably resolve smaller features and spacings. The nature of optics is such that the ability to obtain finer resolution is limited in part by the wavelength of light (or other radiation) used to create the lithographic pattern. Thus, there has been a continual trend toward use of shorter light wavelengths for lithographic processes. Recently, the trend has been to move from so-called I-line radiation (350 nm) to 248 nm radiation.

For future reductions in size, the need to use 193 nm radiation appears likely. Unfortunately, resist compositions at the heart of current 248 nm lithographic processes are typically unsuitable for use at shorter wavelengths.

While a photoresist composition must possess desirable optical characteristics to enable image resolution at a desired radiation wavelength, the photoresist composition must also possess suitable chemical and mechanical properties to enable transfer to the image from the patterned photoresist to an underlying substrate layer(s). Thus, a patternwise exposed positive photoresist must be capable of appropriate dissolution response (i.e. selective dissolution of exposed areas) to yield the desired photoresist structure. Given the extensive experience in the photolithographic arts with the use of aqueous alkaline developers, it is important to achieve appropriate dissolution behavior in such commonly used developer solutions.

The patterned photoresist structure (after development) must be sufficiently resistant to enable transfer of the pattern to the underlying layer(s). Typically, pattern transfer is performed by some form of wet chemical etching or ion etching. The ability of the patterned photoresist layer to withstand the pattern transfer etch process (i.e., the etch resistance of the photoresist layer) is an important characteristic of the photoresist composition.

While some photoresist compositions have been designed for use with 193 nm radiation, these compositions have generally failed to deliver the true resolution benefit of shorter wavelength imaging due to a lack of performance in one or more of the above mentioned areas. The resist compositions disclosed in the above-referenced applications represent advancement over the prior art in that the resists are capable of delivering the lithographic performance associated with 193 nm lithography, however there remains a desire for improved photoresist compositions useful in 193 nm lithography. For example, there is a desire for resist compositions exhibiting improved development characteristics (e.g., resolution, development speed, contrast, shrinkage, etc.), improved etch resistance, and improved lithographic process window.

SUMMARY OF THE INVENTION

The invention provides resist compositions which are capable of high resolution lithographic performance, especially using 193 nm imaging radiation. The resist compositions of the invention possess the combination of imageability, developability and etch resistance needed to provide pattern transfer at very high resolutions which are limited only by the wavelength of imaging radiation. The resist compositions of the invention are generally characterized by the presence of (a) an imaging polymer comprising a monomer selected from the group consisting of a cyclic olefin, an acrylate and a methacrylate, (b) a radiation-sensitive acid generator, and (c) a lactone additive.

The invention also provides lithographic methods using the resist compositions of the invention to create resist structures and methods using the resist structures to transfer patterns to an underlying layer(s). The lithographic methods of the invention are preferably characterized by the use of 193 nm ultraviolet radiation patternwise exposure. The methods of the invention are preferably capable of resolving features of less than about 150 nm in size, more preferably less than about 115 nm in size (using 0.68 numerical aperture optics) without the use of a phase shift mask.

In one aspect, the invention encompasses a resist composition comprising:
  (a) an imaging polymer comprising a monomer selected from the group consisting of a cyclic olefin, an acrylate and a methacrylate,
  (b) a radiation-sensitive acid generator, and
  (c) a lactone additive.

The polymers of the invention are preferably cyclic olefin polymers. The lactone additive preferably contains at least 10 carbon atoms.

In another aspect, the invention encompasses a method of creating a patterned resist structure on a substrate, the method comprising:
  (a) providing a substrate having a surface layer of the resist composition of the invention,
  (b) patternwise exposing the resist layer to radiation whereby portions of the resist layer are exposed to radiation, and
  (c) contacting the resist layer with an aqueous alkaline developer solution to remove the exposed portions of the resist layer to create the patterned resist structure.

Preferably, the radiation used in step (b) in the above method is 193 nm ultraviolet radiation.

The invention also encompasses processes for making conductive, semiconductive, magnetic or insulative structures using the patterned resist structures containing the compositions of the invention.

These and other aspects of the invention are discussed in further detail below.

DETAILED DESCRIPTION OF THE INVENTION

The resist compositions of the invention are generally characterized by the presence of (a) an imaging polymer comprising a monomer selected from the group consisting of a cyclic olefin, an acrylate and a methacrylate, (b) a radiation-sensitive acid generator, and (c) a lactone additive. These compositions are especially capable of providing high resolution lithographic patterns using 193 nm radiation with good developability and pattern transfer characteristics.

The invention further encompasses patterned resist structures containing the resist compositions of the invention, as well as processes for creating the resist structures and using the resist structures to form conductive, semiconductive and/or insulative structures.

The resist compositions of the invention preferably comprise:
(a) an imaging polymer comprising a monomer selected from the group consisting of a cyclic olefin, an acrylate and a methacrylate,
(b) a radiation-sensitive acid generator, and
(c) a lactone additive.

The imaging polymer is preferably a polymer having substantial transparency at about 193 nm wavelength radiation. The imaging polymer may be an acrylate polymer such as described in U.S. Pat. No. 5,580,694, the disclosure of which is incorporated herein by reference. More preferably, the imaging polymer contains at least some cyclic olefin monomer. Examples of polymer containing cyclic olefin monomers may be of the so-called alternating copolymer variety such as disclosed in U.S. Pat. Nos. 5,843,624 and 6,048,664 and in U.S. patent application Ser. No. 09/566,397, filed on May 5, 2000, entitled "Copolymer Photoresist with Improved Etch Resistance"; the disclosures of these documents is incorporated herein by reference. Most preferably, the imaging polymer is a non-alternating (as opposed to alternating copolymers where polymerization preferentially occurs in alternation sequence of monomers) copolymer containing cyclic olefin monomers. Examples of such non-alternating copolymers are described in the related patent applications cross-referenced above, the disclosures of which are incorporated herein by reference. Other examples of such non-alternating copolymers are described in U.S. patent application Ser. No. 09/566,395, filed on May 5, 2000, entitled "Photoresist Compositions with Cyclic Olefin Polymers having Lactone Moiety", the disclosure of which is incorporated herein by reference.

The imaging polymer is preferably further characterized by the presence of acid-labile pendant moieties on at least a portion of the monomers making up the imaging polymer. Preferred acid-labile protecting moieties are selected are selected from the group consisting of tertiary alkyl (or cycloalkyl) carboxyl esters (e.g., t-butyl, methyl cyclopentyl, methyl cyclohexyl, methyl adamantyl), ester ketals, and ester acetals. Tertiary butyl carboxyl ester is a most preferred acid-labile protecting moiety. If desired, combinations of monomers having differing protecting functional groups may be used. The acid-labile pendant moieties are preferably present in sufficient amount to maintain the imaging polymer substantially insoluble in aqueous alkaline developers in the prior to exposure to any imaging radiation. Upon exposure to imaging radiation, at least a portion of the acid labile moieties in the exposed portions of the resist would be cleaved causing a shift in the aqueous alkaline solubility of the exposed portions of the resist.

The imaging polymer is preferably further characterized by the presence of polar functional moieties which promote solubility in aqueous alkaline solutions. Preferred polar moieties are acidic polar moieties having a $pK_a \leq 13$. More preferably, the polar groups are selected from the group consisting of carboxyl, sulfonamidyl, fluoroalcohol, and other acidic polar groups, most preferably carboxyl groups. The polar moieties are preferably present in sufficient amounts to enable the radiation-exposed resist to be aqueous alkaline soluble.

The various protecting (acid-labile) moieties and polar moieties described above are preferably pendant from acrylate, methacrylate or cyclic olefin monomers which make up the imaging polymer. More preferably, the various protecting (acid-labile) moieties and polar moieties are pendant from cyclic olefin monomers which form part or all of the imaging polymer.

Thus, the imaging polymer preferably contains cyclic olefin monomers having polar functional moieties that promote alkaline solubility. Examples of cyclic olefin monomers include the following monomers illustrated by structure (I) below where $R_1$ represents a polar moiety and n is zero or some positive integer:

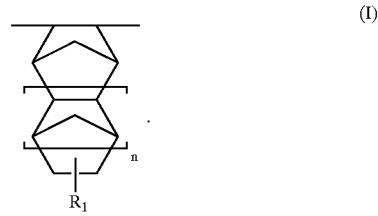

(I)

More preferably, the cyclic olefin monomers (I) are selected from:

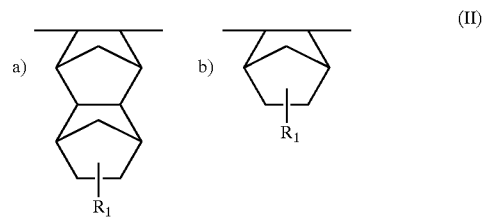

(II)

where $R_1$ represents a polar moiety which promotes solubility in aqueous alkaline solutions.

The imaging polymer also preferably contains cyclic olefin monomers having an acid labile moiety that inhibits solubility in aqueous alkaline solutions. Examples of cyclic olefin monomers include the following monomers illustrated by structure (III) below where $R_2$ represents an acid-labile protecting moiety and n is zero or some positive integer:

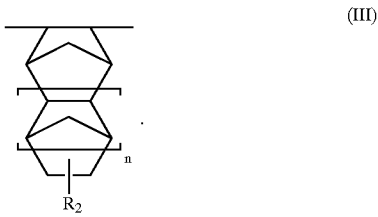

(III)

More preferably, the cyclic olefin units ii) are selected from:

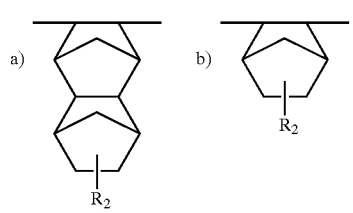

where $R_2$ represents an acid-labile protecting moiety.

For lithographic applications used in the manufacture of integrated circuit structures and other microscopic structures, the cyclic olefin polymers of invention preferably contain at least about 20 mole % of cyclic olefin monomers of structure (III), more preferably about 40–90 mole %, most preferably about 60–90 mole %. The cyclic olefin polymers of the invention preferably contain about 10–80 mole % of cyclic olefin monomers of structure (I), more preferably about 10–60 mole %. Where cyclic olefin monomers of structure (I) comprise units having a carboxylic acid polar group, those units are preferably present at about 5 to 30 mole %, more preferably about 10–25 mole %, most preferably about 10–20 mole %, based on the overall cyclic olefin polymer composition. The cyclic olefin polymers of the invention may contain other monomers units in addition to units i) and ii). Preferably, the cyclic olefin polymers of the invention contain about 40 mole % or less of such other monomeric units, more preferably about 20 mole % or less. Most preferably, the cyclic olefin polymers of the invention consist essentially of cyclic olefin units i) and ii).

The resist compositions of the invention are further characterized by the presence of a lactone additive. The lactone additive preferably has one or more bulky constituents such as saturated alicyclic structures. The lactone additive preferably is free of unsaturated carbon-carbon bonds. Preferred alicyclic structures are selected from the group consisting of norbornyl, adamantyl and saturated fused polycyclic hydrocarbons (more preferably bicyclic). Alternatively, the bulky constituent may be an acyclic saturated hydrocarbon (linear or branched), preferably containing at least 10 carbon atoms. The lactone ring may be five-, six-, or seven-membered, more preferably the lactone ring is five-membered. The lactone moiety is preferably present as an ester group, a spiro-bonded lactone or a fused lactone. Alternatively other bonding structures are possible such as some of those shown in structures (V) below. Preferably, the lactone additive contains at least 10 carbons, more preferably about 14–20 carbons. Examples of possible lactone additive structures are illustrated below:

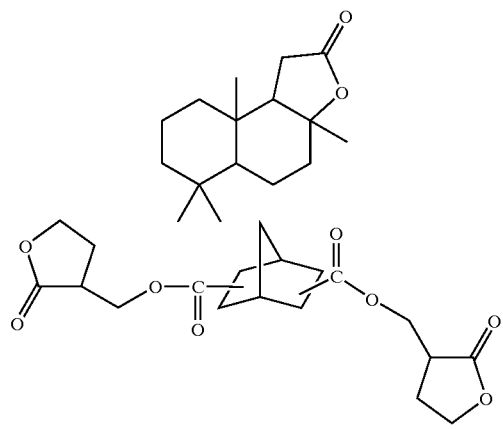

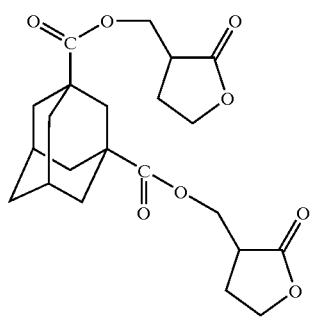

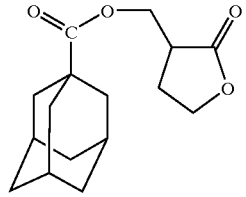

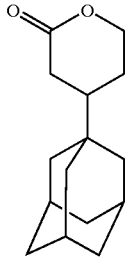

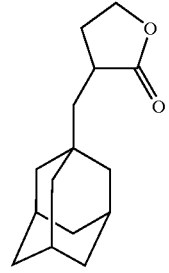

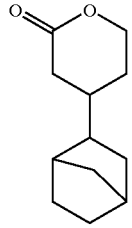

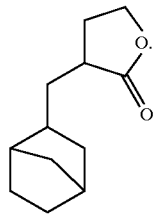

In addition to the cyclic olefin polymers, the resist compositions of the invention contain a radiation-sensitive acid generator. The invention is not limited to the use of any specific radiation-sensitive acid generator or combination of acid generators, that is the benefits of the invention may be achieved using various radiation-sensitive acid generators known in the art. Preferred acid generators are those which contain reduced amounts (or preferably no) aryl moieties. Where aryl-containing acid generator is employed, the absorptive characteristics of the acid generator at 193 nm may restrict the amount of acid generator that can be included in the formulation.

Examples of suitable radiation-sensitive acid generators include (but preferably with alkyl substituted for one or more of any indicated aryl moieties) onium salts such as triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate, etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide),α-α'bis-sulfonyl diazomethanes, naphthoquinone-4-diazides, alkyl disulfones and others.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate, cyclohexanone, and ethyl cellosolve acetate.

The compositions of the invention may further contain minor amounts of auxiliary components such as dyes/sensitizers, base additives, etc. as are known in the art. Preferred base additives are weak bases which scavenge trace acids while not having an excessive impact on the performance of the resist. Preferred base additives are (aliphatic or alicyclic) tertiary alkyl amines or t-alkyl ammonium hydroxides such as t-butyl ammonium hydroxide (TBAH).

The resist compositions of the invention preferably contain about 0.5–20 wt. % (more preferably about 3–15 wt. %) radiation-sensitive acid generator based on the total weight of cyclic olefin polymer in the composition. Where a solvent is present, the overall composition preferably contains about 50–90 wt. % solvent. The composition preferably contains about 1 wt. % or less of said base additive based on the total weight of acid sensitive polymer. The resist compositions of the invention preferably contain at least about 5 wt. % of lactone additive based on the total weight of cyclic olefin polymer in the composition, more preferably about 10–30 wt. %, most preferably about 10–20 wt. %.

The invention is not limited to any specific method of synthesizing the cyclic olefin polymers used in the invention. Preferably, the cyclic olefin polymers are formed by addition polymerization. Examples of suitable techniques are disclosed in U.S. Pat. Nos. 5,468,819 and 5,705,503 assigned to B.F. Goodrich Company, the disclosures of which are incorporated herein by reference. The cyclic olefin polymers of the invention preferably have a weight average molecular weight of about 5,000–100,000, more preferably about 10,000–50,000.

The resist compositions of the invention can be prepared by combining the cyclic olefin polymer, radiation-sensitive acid generator, lactone additive and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for lithographic processes using 193 nm UV radiation. Where use of other radiation (e.g. mid-UV, 248 nm deep UV, x-ray, or e-beam) is desired, the compositions of the invention can be adjusted if necessary by the addition of an appropriate dye or sensitizer to the composition. The general use of the resist compositions of the invention in lithography for semiconductors is described below.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer before application of the resist layer. The ARC layer may be any conventional ARC which is compatible with acid catalyzed resists.

Typically, the solvent-containing resist composition is applied to the desired semiconductor substrate using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist. Preferably, the pre-exposure bake is performed at temperatures which are at least 20° C. below $T_g$.

After solvent removal, the resist layer is then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 15–30 millijoules/cm$^2$).

After the desired patternwise exposure, the resist layer is typically baked to further complete the acid-catalyzed reaction and to enhance the contrast of the exposed pattern. The post-exposure bake is preferably conducted at about 100–175° C., more preferably about 125–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. Preferably, the resist compositions of the invention can be developed with conventional 0.26N aqueous alkaline solutions. The resist compositions of the invention can also be developed using 0.14N or 0.21N or other aqueous alkaline solutions. The resulting resist structure on the substrate is then typically dried to remove any remaining developer solvent. The resist compositions of the invention are generally characterized in that the product resist structures have high etch resistance. In some instances, it may be possible to further enhance the etch resistance of the resist structure by using a post-silylation technique using methods known in the art. The compositions of the invention enable the reproduction of lithographic features The pattern from the resist structure may then be transferred to the material (e.g., ceramic, metal or semiconductor) of the underlying substrate. Typically, the transfer is achieved by reactive ion etching or some other etching technique. In the context of reactive ion etching, the etch resistance of the resist layer is especially important. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE

An imaging cyclic olefin copolymer, derived from addition polymerization of nonrbornene-t-butylester and nonrbornene-carboxylic acid (85/15 mole ratio), was dissolved in propylene glycol monomethyl ether acetate to form a 10 wt. % solids polymer solution. The polymer solution was combined with 1) a lactone additive, sciareolide (lactone (a) of structures (V) above, available from Aldrich Chemical Company Inc.), at 10 parts by weight per 100 parts of copolymer and 2) bis-t-butylphenyl iodonium perfluorooctane sulfonate at 4 parts per 100 parts of copolymer. A base additive (tertrabutylammonium hydroxide) was also added to the resulting formulation at 0.2 parts by weight per 100 parts of copolymer to achieve a resist formulation.

The resist was spin-coated onto a silicon wafer and then soft baked at 130° C. for 60 seconds on a vacuum hot plate yielding a film of 0.4 micron thickness. The resist was then imaged (patternwise exposed) using 193 nm radiation (28 mJ/cm2) on an ISI (Integrated Solutions, Inc.) microstepper. The exposed wafers were then post-exposure baked on vacuum hot plate at 150° C. for 90 seconds. The exposed wafers were then developed in 0.263N TMAH for 60 seconds. The resulting resist structure had a pattern of clean 130 nm 1:1 line/space features.

What is claimed is:

1. A patterned resist structure on a substrate, said resist comprising (a) an imaging polymer comprising a monomer selected from the group consisting of a cyclic olefin, an acrylate and a methacrylate, (b) a radiation-sensitive acid generator, and (c) a non-polymeric lactone additive.

2. A method of forming a patterned resist structure on a substrate, said method comprising:
   (A) applying a resist composition to said substrate to form a resist layer on said substrate, said resist composition comprising (a) an imaging polymer comprising a monomer selected from the group consisting of a cyclic olefin, an acrylate and a methacrylate, (b) a radiation-sensitive acid generator, and (c) a non-polymeric lactone additive,
   (B) patterwise exposing said substrate to radiation whereby acid is generated by said radiation-sensitive acid generator in exposed regions of said resist layer by said radiation, and
   (C) contacting said substrate with an aqueous alkaline developer solution, whereby said exposed regions of said resist layer are selectively dissolved by said developer solution to reveal said patterned resist structure on said substrate.

3. The method of claim 2 wherein said radiation used in step (B) is 193 nm ultraviolet radiation.

4. The method of claim 2 wherein said substrate is baked between steps (B) and (C).

5. A method of forming a patterned material structure on a substrate, said material being selected from the group consisting of semiconductors, ceramics and metals, said method comprising:
   (A) providing a substrate with a layer of said material,
   (B) applying a resist composition to said substrate to form a resist layer over said material layer, said resist composition comprising (a) an imaging polymer comprising a monomer selected from the group consisting of a cyclic olefin, an acrylate and a methacrylate, (b) a radiation-sensitive acid generator, and (c) a non-polymeric lactone additive,
   (C) patternwise exposing said substrate to radiation whereby acid is generated by said radiation-sensitive acid generator in exposed regions of said resist layer by said radiation,
   (D) contacting said substrate with an aqueous alkaline developer solution, whereby said exposed regions of said resist layer are selectively dissolved by said developer solution to reveal a patterned resist structure, and
   (E) transferring resist structure pattern to said material layer, by etching into said material layer through spaces in said resist structure pattern.

6. The method of claim 5 wherein said material is metal.

7. The method of claim 5 wherein said etching comprises reactive ion etching.

8. The method of claim 5 wherein at least one intermediate layer is provided between said material layer and said resist layer, and step (E) further comprises etching through said intermediate layer.

9. The method of claim 5 wherein said radiation has a wavelength of about 193 nm.

10. The method of claim 5 wherein said substrate is baked between steps (C) and (D).

* * * * *